United States Patent [19]
Miki et al.

[11] Patent Number: 5,283,581
[45] Date of Patent: Feb. 1, 1994

[54] ANALOG VOLTAGE SUBTRACTING CIRCUIT AND AN A/D CONVERTER HAVING THE SUBTRACTING CIRCUIT

[75] Inventors: Takahiro Miki; Toshio Kumamoto, both of Hyogo, Japan

[73] Assignee: Mitsubishi Denki Kabushiki Kaisha, Tokyo, Japan

[21] Appl. No.: 952,413

[22] Filed: Sep. 29, 1992

[30] Foreign Application Priority Data

Oct. 1, 1991 [JP] Japan ................................ 3-253917

[51] Int. Cl.⁵ .............................................. H03M 1/14
[52] U.S. Cl. ....................................... 341/156; 341/118
[58] Field of Search ........................... 341/156, 118, 122

[56] References Cited

U.S. PATENT DOCUMENTS

| | | | |
|---|---|---|---|
| 3,721,975 | 3/1973 | Brinkman et al. | 341/156 |
| 3,789,389 | 1/1974 | Lenhoff, Jr. | 341/156 |
| 4,124,844 | 11/1978 | Black et al. | 341/156 |
| 4,196,419 | 4/1980 | Brown | 341/156 |
| 4,763,107 | 8/1988 | Koen et al. | 341/156 |

OTHER PUBLICATIONS

Sone et al., "A 10 bit 80 MHz Subranging ADC using Redundant Structure for Error Correction," Denshi Joho Tsuushin Gakkai 1989, pp. 5-393 to 5-394.

*Primary Examiner*—Marc S. Hoff
*Attorney, Agent, or Firm*—Lowe, Price, LeBlanc & Becker

[57] ABSTRACT

An analog voltage subtracting circuit for calculating a difference between an analog input voltage and a voltage drop caused by a load includes an analog voltage generator 7 for generating an analog voltage, a load 3 having one end connected to an output of the analog voltage generator 7 and the other end connected to an output terminal 2, and a D/A converter 6 applying a positive output current Iout for generating a desired voltage drop at said the other end 4 of the load 3 and for applying a complementary output current $\overline{\text{Iout}}$ complementary to the positive output current Iout to said one end of the load 3. By this structure, a constant current of Iout+$\overline{\text{Iout}}$ flows at said one end 4 of the load 3, and therefore linear output can be provided.

17 Claims, 13 Drawing Sheets

ANALOG VOLTAGE SUBTRACTING CIRCUIT AND AN A/D CONVERTER HAVING THE SUBTRACTING CIRCUIT

BACKGROUND OF THE INVENTION

1. Field of the Invention

The present invention relates to a subtracting circuit providing a difference between an analog input voltage and a voltage dropped by a load, and to an A/D converter including the subtracting circuit.

2. Description of the Background Art

An analog voltage subtracting circuit provides a difference between an analog input voltage and a voltage dropped by a load, and it is used in an A/D converter, for example. FIG. 10 is a block diagram of a conventional subtracting circuit. The subtracting circuit A shown in FIG. 10 includes an analog voltage receiving terminal 1, an output terminal 2 outputting the result of subtraction, a load 3' and an D/A converter 6. An analog voltage generator 7' is connected to the analog voltage receiving terminal 1. The analog voltage generator 7' applies a DC voltage V1 to the analog voltage receiving terminal 1. The load 3' has one end 5 connected to the analog voltage receiving terminal 1 and the other end 4 connected to the output terminal 2. Passive element such as a resistor, a capacitor or an inductance, or active element such as a diode or a transistor may be used as the load 3'. If a passive element is used, linear output voltage is provided, and if an active element is used, non-linear output voltage is provided. The D/A converter 6 has a positive output terminal 6a connected to the other end 4 of the load 3' and a complementary output terminal 6b coupled to the supply potential Vcc. The D/A converter 6 generates a positive output current Iout in response to a bit signal designating the magnitude of the externally applied positive output current, and applies this to the other end 4 of the load 3' through the positive output terminal 6a.

The operation of the subtracting circuit shown in FIG. 10 will be described. The output voltage V2 can be ideally represented by applying Ohm's law, $$V2 = V1 - Iout \cdot Z \quad (1)$$

Where V1 represents the voltage at the analog voltage receiving terminal 1, V2 represents the voltage at the output terminal 2 and Z represents impedance of the load 3'. Namely, the dropped voltage Iout·Z is subtracted from the input voltage V1.

However, the equation (1) can be applied only to an ideal case. Actually, the resistance of the output stage of the analog voltage generator 7' is limited, and because of this influence, the voltage V2 at the output terminal 2 becomes non-linear, which will be described in detail later.

An A/D converter capable of high speed operation and having high resolution is in strong demand especially in the field of image processing. An A/D converter having conversion frequency higher than 50 MHz and the resolution of 10 bits is necessary for transmitting high definition television signals. If such an A/D converter is formed by a flash A/D converter, the input capacitance, chip area and power consumption are increased. In order to solve this problem, recently a serial-parallel type A/D converters have been developed, in which an analog input voltage is divided into higher and lower bits to be subjected to A/D conversion. The above described subtracting circuit is used in this serial-parallel type A/D converter.

FIG. 11 is a block diagram of the serial-parallel type A/D converter, and FIG. 12 is a schematic diagram showing the output stage of the sample hold circuit 7 and the subtracting circuit A of FIG. 11.

Referring to FIG. 11, the A/D converter includes a sample hold circuit 7, an A/D converter 10 for the higher bits, a subtracting circuit A, an amplifier 11 and an A/D converter 12 for the lower bits. The sample hold circuit 7 samples and holds the analog input voltage Vin and outputs an analog voltage V1. The A/D converter 10 for the higher bits roughly A/D converts the analog voltage V1 output from the sample hold circuit 7 to provide higher bits.

The subtracting circuit A includes a resistor 3 as a load, and a D/A converter 6. The resistor 3 has one end 5 connected to an output of the sample hold circuit 7 and the other end connected to the A/D converter 12 for the lower bits. The D/A converter 6 generates a positive output current Iout for generating a desired drop of voltage in the resistor 3 in response to the higher bits calculated by the A/D converter 10 for the higher bits, and applies the same to the other end 4 of the resistor 3. In other words, the subtracting circuit A calculates the difference between the analog voltage V1 output from the sample hold circuit 7 and the voltage value corresponding to the higher bits calculated by the A/D converter 10 for the higher bits.

Referring to FIG. 12, the output stage of the sample hold circuit 7 includes a transistor 7d and a current source 7e. The transistor 7d has its collector connected to a supply terminal Vcc, its base connected to receive the sampled and held signal, and its emitter connected to the current source 7e and to the analog voltage receiving terminal 1.

The current source 7e applies a DC current I7 to the emitter of the transistor 7d. The D/A converter 6 includes switching circuits S1-S8, which switch in response to the higher bit signals from the A/D converter 10 for the higher bits (FIG. 11), and current source 61-68 connected to the corresponding switching circuits. Each of the switching circuits S1-S8 includes two input terminals and one output terminal. One input terminal is connected to the positive output terminal 6a, and the other input terminal is connected to the complementary output terminal 6b. The output terminals of the switching circuits S1-S8 are connected to the corresponding current sources 61-68. The current sources 61-68 generate the current of the same magnitude.

Therefore, the sum of the positive output current Iout and the complementary output current $\overline{Iout}$ is constant, and the positive output current Iout and the complementary output current $\overline{Iout}$ are complementary to each other. The sum will be referred to as a full scale current Ifs in the following.

FIG. 13 shows the ideal input/output characteristic and the actual input/output characteristic of the A/D converter shown in FIGS. 11 and 12. The dotted line represents the ideal input/output characteristic, while the solid line represents the actual input/output characteristic.

The operation of the A/D converter will be described with reference to FIGS. 11 to 13.

The analog input voltage Vin is sampled and held by the sample hold circuit 7, and an analog voltage V1 is generated. The analog voltage V1 is applied to the higher A/D converter 10 and to the resistor 3. The output voltage V1 applied to the higher A/D converter 10 is subjected to rough A/D conversion. The A/D converted value (higher bit signal) is applied to each of the switching circuits S1-S8 of the D/A converter 6. The switching circuits S1-S8 switch in response to the higher bit signals. FIG. 12 shows an example in which the higher bit signal is "101" and five switching circuits S1-S5 are on. In response to the switching operation of the switching circuits S1-S8, a positive output current Iout corresponding to the bit signal is generated, and the positive output current Iout thus generated flows to the resistor 3. Consequently, a voltage V2 which is ideally represented by $$V2 = V1 - Iout \cdot R \quad (2)$$

is output, where R represents the resistance value of the resistor 3.

In this manner, the dropped voltage caused by the resistor 3 can be subtracted from the analog voltage V1. The input/output characteristic represented by the equation (2) is shown by the dotted line in FIG. 13.

However, the transistor 7d of the output stage constitutes an emitter follower circuit, and there is a limited output resistance between the base and the emitter, which output resistance is non-linear. Not only the emitter follower circuit but circuitry using non-linear element such as a transistor has non-linear output.

The non-linear input/output characteristic of the above mentioned emitter follower circuit will be described in greater detail. The following approximation is widely known where Vb represents the base voltage of transistor 7d, Ic represents the collector current, Ie represents the emitter current and α represents the rate of amplification of base-ground current:

$$Ic = Is \cdot exp\{(Vb - V1)/Vt\} = \alpha \quad (3)$$

Is represents saturation current, Vt represents a thermal voltage, and these values and α are multipliers not dependent on other variables. From the equation (3), V1 can be represented as $$V1 = Vb - Vt \cdot Log(\alpha \cdot Ie/Is) \quad (4)$$

The emitter current Ie is the sum of the current I7 of the current source 7e and the positive output current from D/A converter 6, and therefore, $$V1 = Vb - Vt \cdot log\{\alpha \cdot (I7 + Iout)/Is\} \quad (5)$$

Thus the analog voltage V1 changes non-linearly dependent on the positive output current Iout, and as a result, the output voltage V2 represented by the equation (2) also becomes non-linear. This is shown by the solid line in FIG. 13. When the value of the analog voltage V1 with Iout=0 is represented by V10, this value is calculated as $$VT10 = Vb - Vt \cdot log(\alpha \cdot I7/Is) \quad (6)$$

Since the conventional subtracting circuit and the A/D converter are structured as described above, the analog voltage V1 and the output voltage V2 change non-linearly dependent on the change in the output of the D/A converter. Consequently, precise result of subtraction can not be obtained, causing errors in the result of A/D conversion.

SUMMARY OF THE INVENTION

Therefore, an object of the present invention is to obtain a linear output in a subtracting circuit providing a difference between an analog voltage and a voltage drop caused by a load.

Another object of the present invention is to prevent generation of errors by obtaining a linear output in an A/D converter which A/D-converts an analog voltage by dividing the same into higher and lower bits.

Briefly stated, the analog voltage subtracting circuit of the present invention includes an analog voltage generator, a load, and a complementary current output device.

The analog voltage generator generates an analog voltage. The load has one end connected to an output of the analog voltage generating circuit, and the other end connected to an output terminal.

The complementary current output device applies a first current for generating a desired voltage drop to the other end of the load, and applies a second current complementary to the first current to one end of the load.

In operation, a first current for generating a desired voltage drop is provided by the complementary current output device to one end of the load, and a second current complementary to the first current is applied by the complementary current output device to the other end of the load. Therefore, the current which is the sum of the first and second current flows through one end of the load. Since the first and the second currents are complementary to each other, the sum is constant, and therefore the potential at one end of the load does not change. As a result, the output voltage becomes linear.

By this invention, the output voltage can be made linear, and therefore precise result of subtraction can be provided.

The A/D converter in accordance with another aspect of the present invention is a device for A/D-converting an analog input voltage by dividing the same into higher and lower bits, which includes a sample hold device, a higher A/D converter, subtracting device and a lower A/D converter.

The sample hold device samples and holds the analog input voltage.

The higher A/D converter A/D converts roughly the sampled and held analog input voltage to provide higher bits.

The subtracting device includes a load and a D/A converter.

The load has one end connected to an output of the sample hold device, and the other end connected to the lower A/D converter.

The D/A converter generates a first current corresponding to the higher bits calculated by the higher A/D converter and a second current complementary to the first current, applies the second current to one end of the load and applies the first current to the other end of the load.

The lower A/D converter A/D-converts the result of subtraction of the subtracting device to provide the lower bit.

In accordance with this aspect of the present invention, since precise result of subtraction is used for lower A/D conversion, generation of errors can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
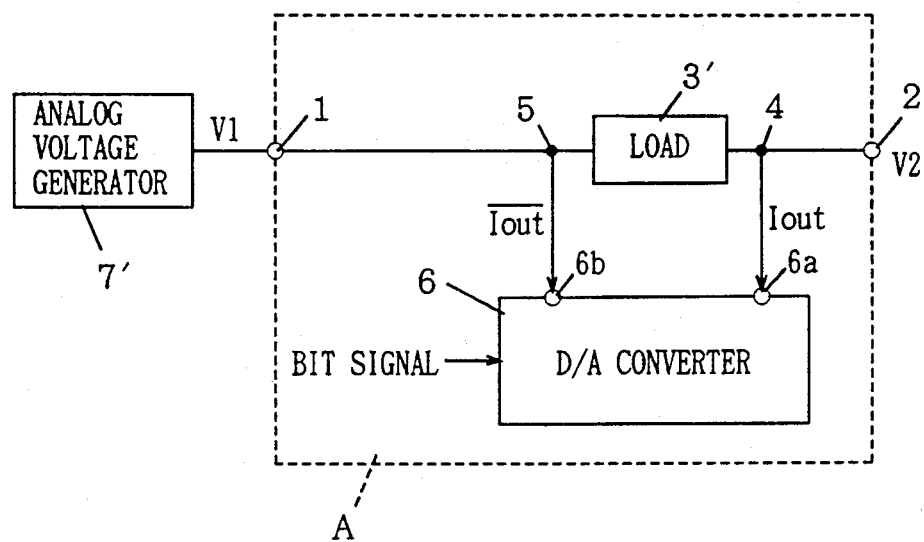
FIG. 1 is a schematic diagram showing one embodiment of the subtracting circuit in accordance with the present invention.
Figure 10:
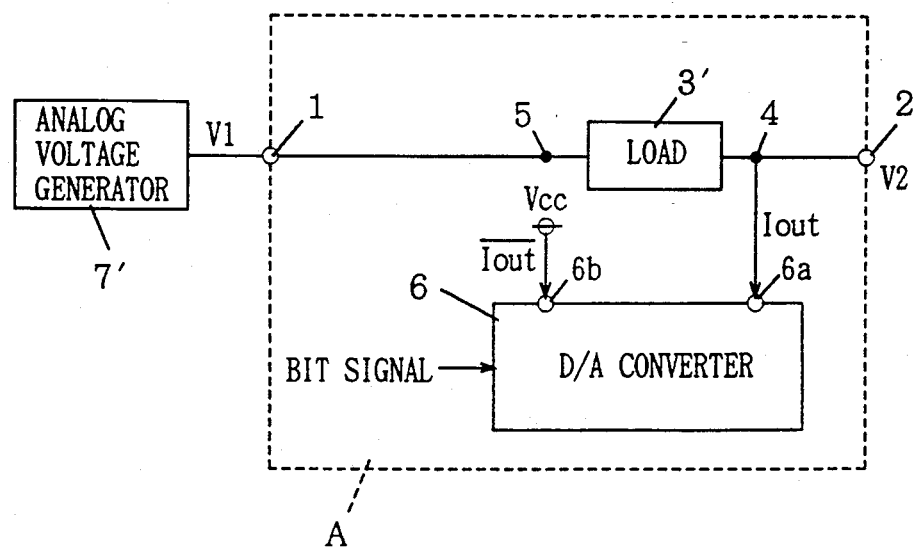
FIG. 10 is a block diagram of a conventional subtracting circuit.

FIG. 1 is a block diagram of a subtracting circuit showing one embodiment of the present invention. Referring to FIG. 1, the subtracting circuit A differs from the subtracting circuit of FIG. 10 in that the complementary output terminal 6b of the D/A converter 6 is connected to one end 5 of the load 3'. Other portions of the circuit are the same as those of the subtracting circuit shown in FIG. 10, which are denoted by the same reference characters and the description thereof is not repeated.

In operation, the D/A converter 6 generates a positive output current Iout and a complementary output current $\overline{Iout}$ in response to an externally applied bit signal. The positive output current Iout is applied to the other end 4 of the load 3' through the positive output terminal 6a, while the complementary output current $\overline{Iout}$ is applied to one end 5 of the load 3' through the complementary output terminal 6b. Consequently, a full scale current Ifs which is the total of the positive output current Iout and the complementary output current $\overline{Iout}$ flows to one end 5 of the load 3'. Consequently, the potential at one end 5 of the load 3' becomes constant, free from the influence of the positive output current Iout, and thus the output voltage V2 becomes linear.

Figure 2:
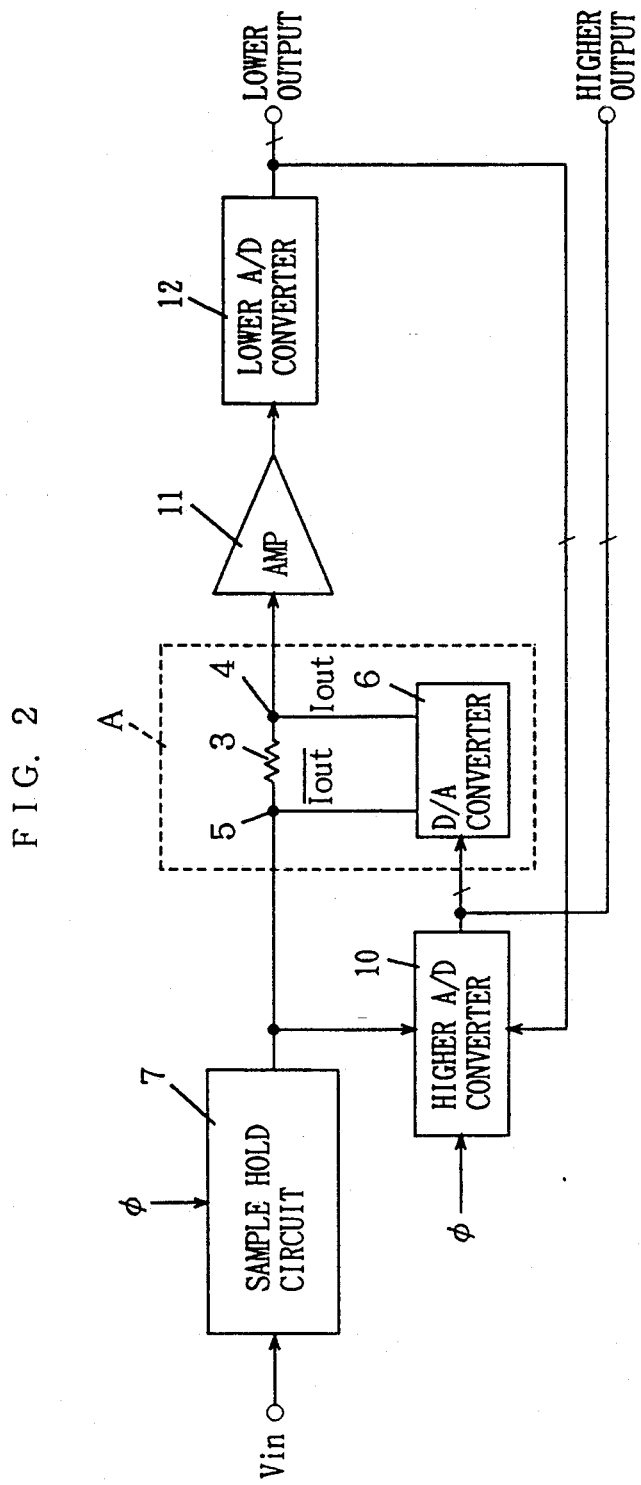
FIG. 2 is a schematic diagram showing an embodiment of the A/D converter of the present invention.
Figure 3:
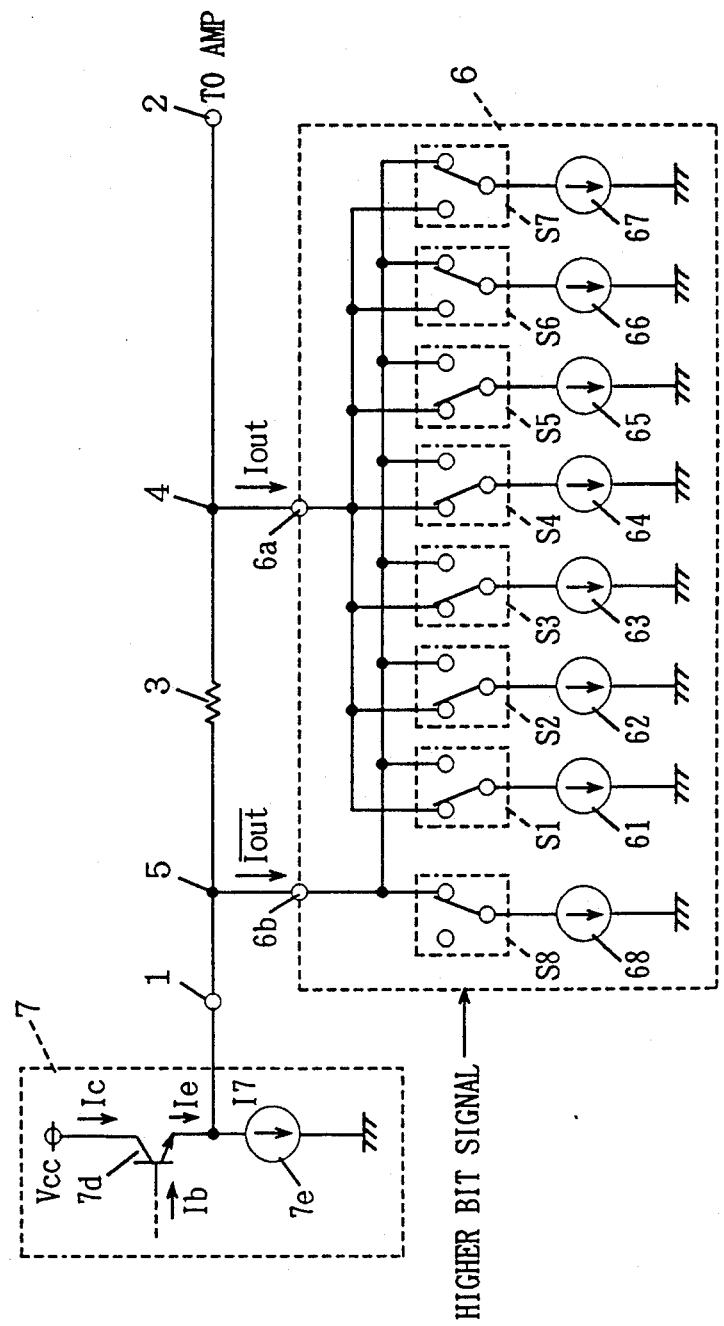
FIG. 3 is a schematic diagram of the output stage of the sample hold circuit 7 and the D/A converter shown in FIG. 2.
Figure 11:
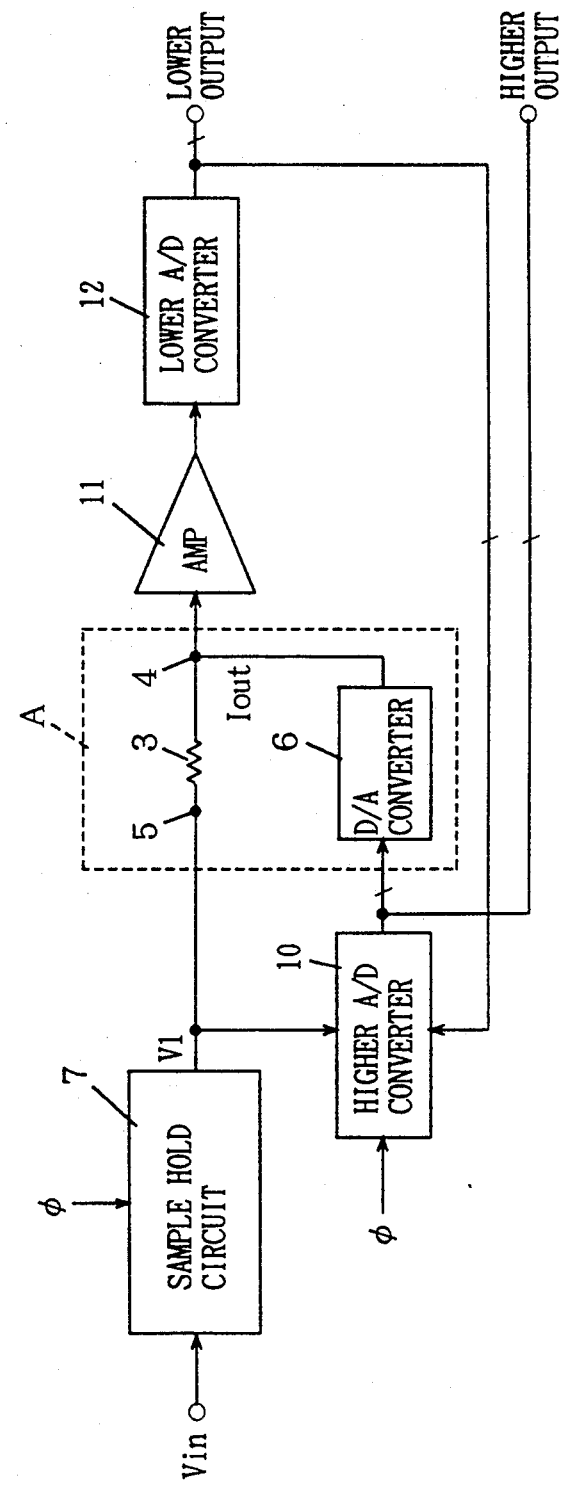
FIG. 11 is a block diagram of a conventional A/D converter.
Figure 12:
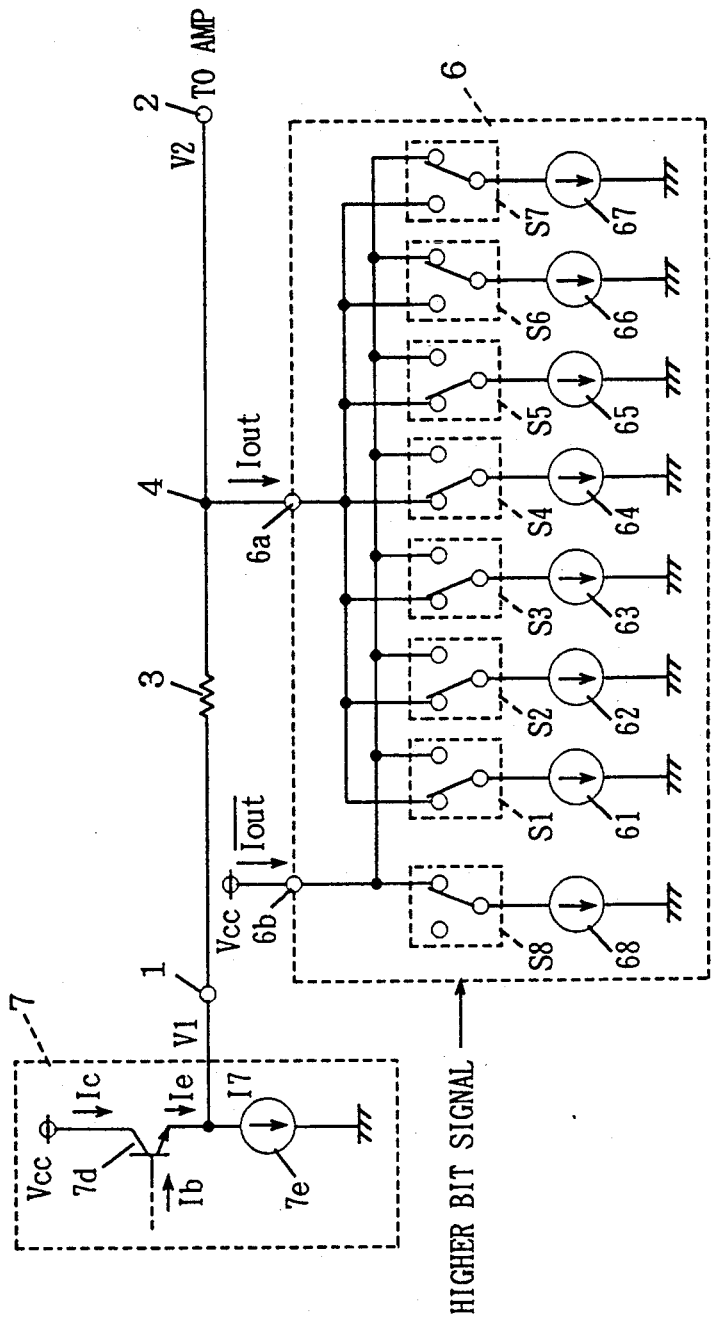
FIG. 12 is a schematic diagram of the output stage of the sample hold circuit and the D/A converter shown in FIG. 11.
Figure 13:
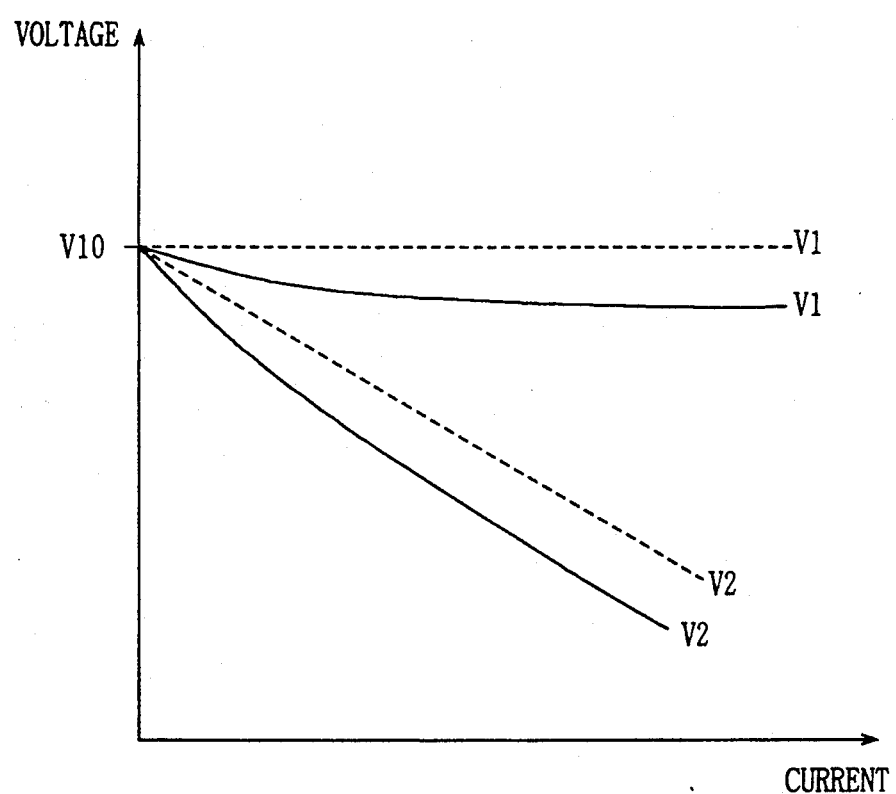
FIG. 13 is a graph showing the input/output characteristic of the subtracting circuit shown in FIGS. 11 and 12.

FIG. 2 is a block diagram showing one embodiment of the A/D converter, and FIG. 3 is a detailed diagram showing the output stage of the sample hold circuit 7 and the D/A converter 6 of FIG. 2. The A/D converter shown in FIGS. 2 and 3 differs from the A/D converter shown in FIGS. 11 and 12 in that the complementary output terminal 6b of the D/A converter is connected to one end 5 of the resistor 3. Other portions are the same as those of FIGS. 11 and 12, and therefore the same portions are denoted by the same reference characters and the description thereof is not repeated.

The operation will be described. As mentioned above, the sum of the complementary output current $\overline{Iout}$ and the positive output current Iout of the D/A converter 6 is a constant full scale current Ifs.

$$Ifs = \overline{Iout} + Iout \quad (7)$$

In this case the emitter current Ie of the transistor 7d is constant and represented by the following equation.

$$Ie = I7 + Iout + \overline{Iout} = I7 + Ifs \quad (8)$$

Therefore, from equations (4) and (7)

$$V1 = Vb - Vt \cdot \log \{a \cdot (I7 + Ifs)/Is\} \quad (9)$$

Figure 4:
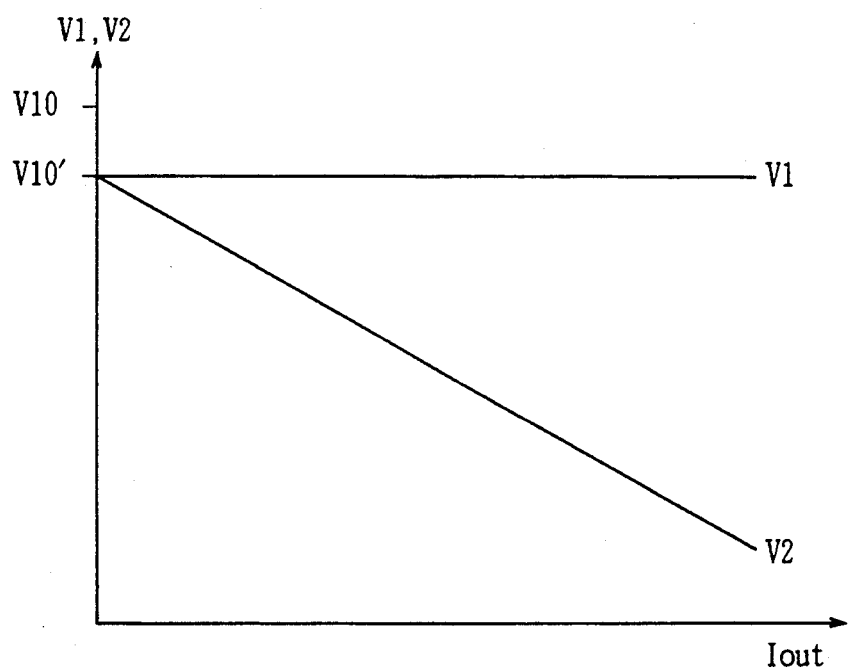
FIG. 4 is a graph showing the input/output characteristic of the subtracting circuit shown in FIGS. 1 to 3.

Thus the analog voltage V1 is not dependent on the positive output current Iout, and it is always constant when the base voltage Vb is constant. Therefore V2 provided in accordance with the equation (2) becomes linear. FIG. 4 is a graph of input/output characteristic showing the relation among the analog voltage V1, the output voltage V2 and the positive output line Iout. In FIG. 4, V10' represents the analog voltage V1 when Iout=0.

The offset voltage V10' is represented as $$V10' = Vb - Vt \cdot \log \{a \cdot (I7 + Ifs)/Is\} < V10 \quad (10)$$

hence there is an offset V10'-V10 generated. If this offset is not inconvenient, it is effective enough. If this offset should be suppressed, there are various methods and among these, the following method is suitable in the circuit shown herein. More specifically, the current value of the current source 7e is reduced to I7'. It is adapted that the sum of I7' and the full scale current Ifs becomes equal to the original current value I7. Namely, if Ie=I7'+Ifs=I7, then V10 and V10' will be equal to each other.

Figure 5:
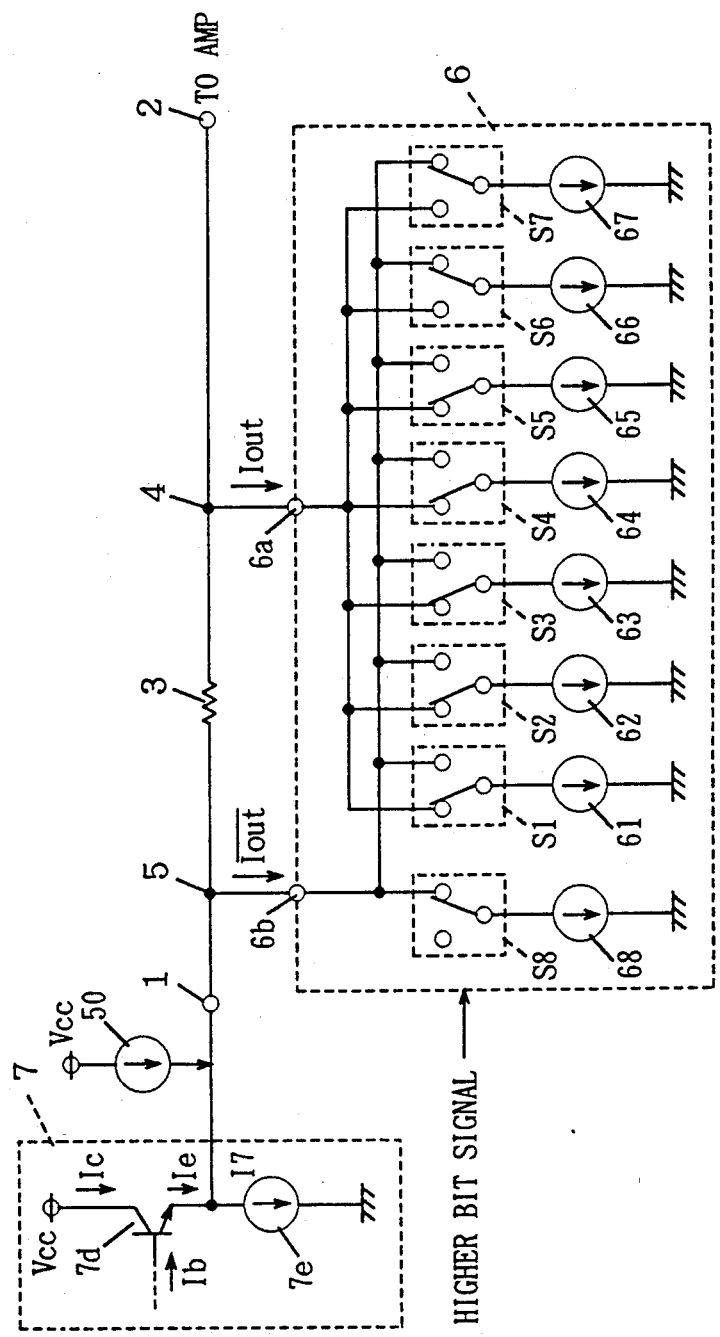
FIG. 5 is a schematic diagram showing a second embodiment of the subtracting circuit.

FIG. 5 is a schematic diagram showing the second embodiment of the subtracting circuit. The subtracting circuit shown in FIG. 5 can remove the aforementioned offset voltage V10'-V10 . The subtracting circuit of FIG. 5 differs from the subtracting circuit A of FIG. 3 in that a current source 50 is connected to the analog voltage receiving terminal 1. The current source 50 applies, a current I50 for removing the offset voltage V10'-V10 to the analog voltage receiving terminal 1. The magnitude of the current I50 is made equal to the full scale current Ifs.with the direction opposite to that of Ifs. Thus the following relation is established, by which V10 becomes equal to V10'.

$$Ie = I7 + Ifs - I50 = I7 \quad (11)$$

Figure 6:
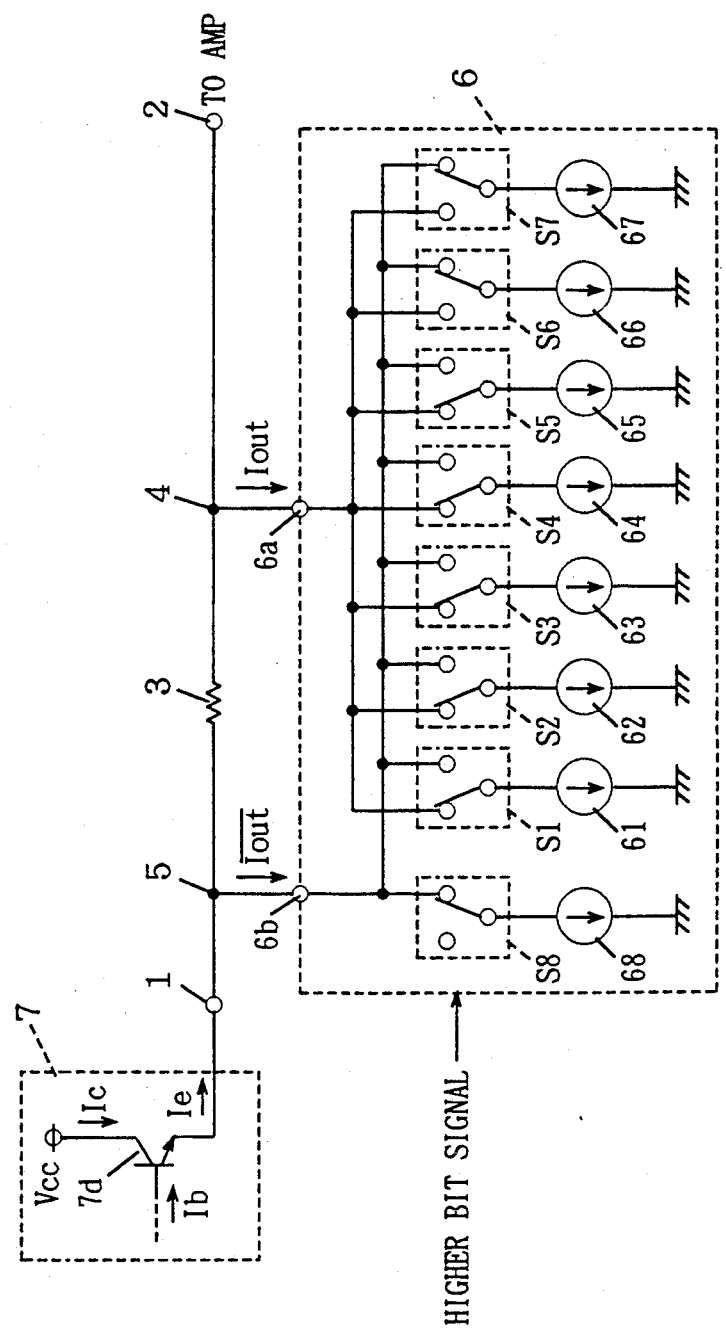
FIG. 6 is a schematic diagram showing a third embodiment of the subtracting circuit.

FIG. 6 is a schematic diagram showing the third embodiment of the subtracting circuit. The subtracting circuit differs from the subtracting circuit of FIG. 3 in that the current source 7e is removed, and the full scale current Ifs is made equal to the current value I7 of the current source mentioned above. Thus V10 becomes equal to V10'. In this example, the number of elements of the sample hold circuit 7 can be reduced. However, if the full scale current Ifs is larger than I7 as high speed operation of the subtracting circuit is desired, the subtracting circuit of this embodiment cannot be applied. In such a case, the subtracting circuit shown in FIG. 7 is used.

Figure 7:
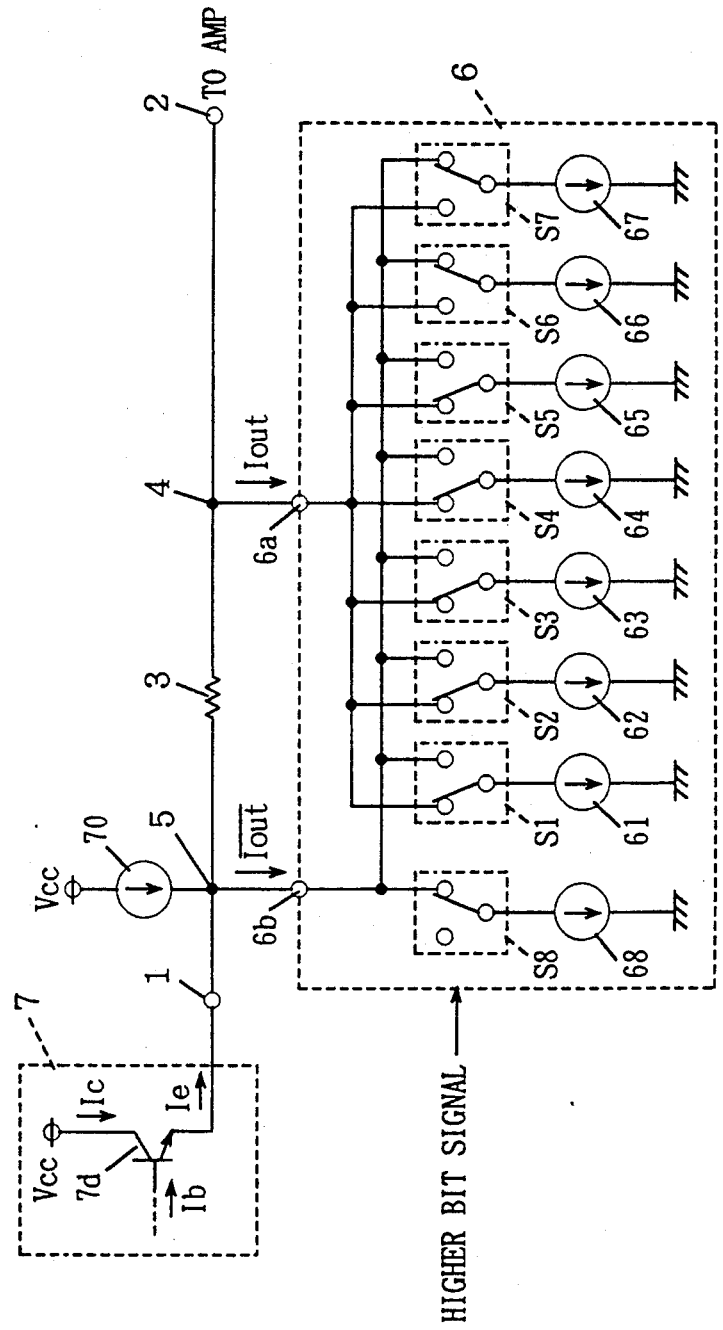
FIG. 7 is a schematic diagram showing a fourth embodiment of the subtracting circuit.

FIG. 7 shows the fourth embodiment of the subtracting circuit. The subtracting circuit differs from the circuit of FIG. 6 in that a current source 70 is connected to one end 5 of the resistor 3. The current I70 generated by the current source 70 is set such that the difference between the full scale current Ifs and the current I70 is equal to I7, hence the emitter current Ie becomes $$Ie = Ifs - I70 = I7 , \quad (12)$$

and thus V10 becomes equal to V10'.

Figure 8:
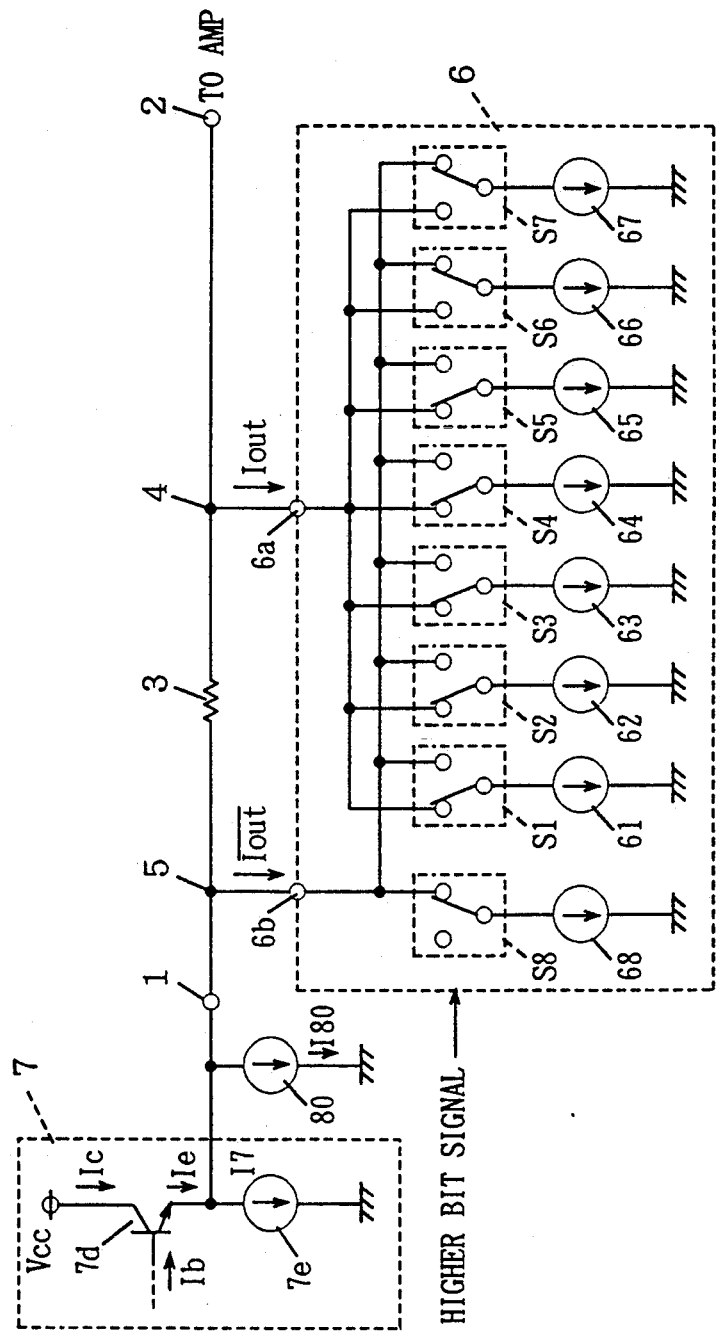
FIG. 8 is a schematic diagram showing a fifth embodiment of the subtracting circuit.

FIG. 8 is a schematic diagram showing the fifth embodiment of the subtracting circuit. The subtracting circuit differs from the circuit of FIG. 3 in that a current source 80 is additionally provided to the emitter of the transistor 7d. The current source 80 generates a current I80. The current I80 flows from one end 5 of the resistor 3 to the ground terminal, increasing the offset voltage. This can shift the dynamic range of the A/D converter.

Figure 9:
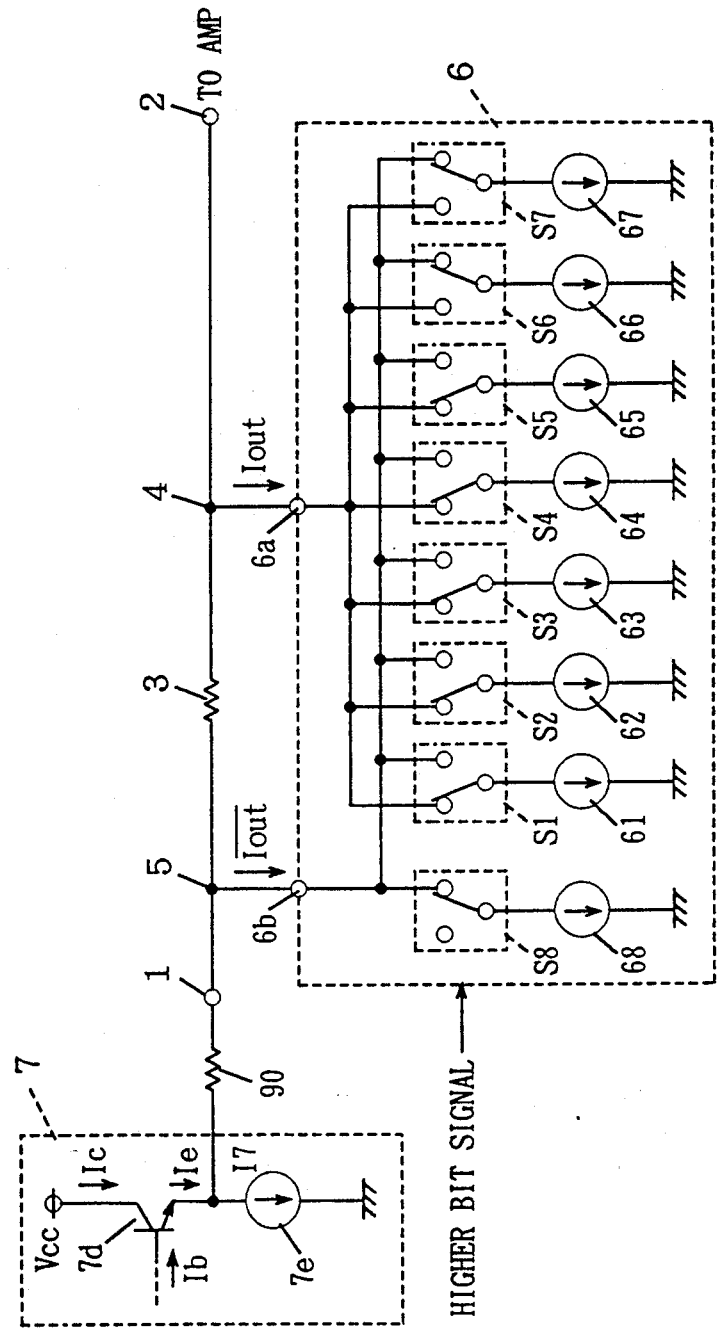
FIG. 9 is a schematic diagram showing a sixth embodiment of the subtracting circuit.

FIG. 9 is a schematic diagram showing the sixth embodiment of the subtracting circuit. The subtracting circuit of this embodiment differs from the circuit of FIG. 3 in that a resistor 90 is provided between the emitter of the transistor 7d and the analog voltage receiving terminal. The resistor 90 further increases the offset voltage, which provides similar effect as provided by the subtracting circuit shown in FIG. 8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A subtracting circuit comprising:
   a) an output terminal for outputting a result of subtraction;
   b) analog voltage generating means for generating an analog voltage, said analog voltage generating means having
      i) impedance converting means for converting an analog input signal of a high impedance to an analog output signal of a lower impedance, and
      ii) offset voltage removing means for removing an offset voltage of said impedance converting means;
   c) load means having one end connected to said analog voltage generating means and the other end connected to the output terminal; and
   d) complementary current output means for applying a first current to generate a desired voltage drop at said other end of said load means and applying a second current complementary to said first current to said one end of said load means.

2. The subtracting circuit according to claim 1, wherein
   said impedance converting means includes an emitter follower circuit and means coupled between an output node of the emitter follower circuit and the ground terminal for generating a constant current; and
   said offset voltage removing means includes means for generating a current having the same magnitude as the sum of the first and second currents output from said complementary current output means and a direction opposite thereto.

3. The subtracting circuit according to claim 1, wherein
   said impedance converting means includes a transistor, said transistor having its base connected to receive the analog input signal of the high impedance, its collector connected to receive a supply voltage, and its emitter connected to one end of said load means.

4. The subtracting circuit according to claim 1, wherein
   said impedance converting means includes a transistor, said transistor having its base connected to receive said analog input signal of high impedance, its collector connected to receive a supply voltage and its emitter connected to one end of said load, and
   said offset voltage removing means includes means for applying, to one end of said load means, a current corresponding to a difference between the sum of the first and second currents outputted from said complementary current output means and the emitter current of said transistor.

5. The subtracting circuit according to claim 1, wherein
   said complementary current output means includes D/A converting means for converting a value A/D-converted by an externally provided A/D converter to an analog signal.

6. A subtracting circuit comprising:
   a) an output terminal for outputting a result of subtraction;
   b) load means having one end connected to said output terminal;
   c) analog voltage generating means for generating an analog voltage and connected to the other end of said load means, said analog voltage generating means having
      i) impedance converting mean as for converting an analog input signal of a high impedance to an analog output signal of a lower impedance, and
      ii) means for drawing out a constant current from one end of said load means for further increasing an offset voltage of said impedance converting means; and
   d) complementary current output means for applying a first current for generating a desired voltage drop to the other end of said load means and applying a second current complementary to said first current to said one end of said load means.

7. A subtracting circuit comprising:
   an output terminal for outputting a result of subtraction;
   a load having a first end and a second end connected to the output terminal;
   complementary current output means for applying a first current to generate a desired voltage drop at said second end of said load and applying a second current complementary to said first current to said first end of said load;
   analog voltage generating means comprising a transistor having its base connected to receive the analog input signal, its collector connected to a supply voltage node and its emitter connected only to the first end of said load and said complementary current output means; and the sum of the first and second complementary currents being substantially equal to the emitter current of said transistor of said analog voltage generating means.

8. The subtracting circuit of claim 1 further comprising means for applying, to first end of said load, a current corresponding to a difference between the sum of the first and second currents outputted from said complementary current output means and the emitter current of said transistor.

9. The subtracting circuit of claim 7, wherein said complementary current output means includes D/A converting means for converting a digital signal, produced by an externally provided A/D converter, to an analog signal.

10. A subtracting circuit coupled to a sample hold circuit of an A/D converter, said subtracting circuit comprising:
   an output terminal for outputting a result of subtraction;
   a load having first and second ends, said first end being connected to said output terminal;
   complementary current output means for applying a first current for generating a desired voltage drop to said first end of said load and applying a second current complementary to said first current to said second end of said load; and
   a resistor connected between said second end of said load and the sample hold circuit for increasing an offset voltage of the sample hold circuit such that the dynamic range of the A/D converter is shifted.

11. An A/D converter for A/D-converting an analog input voltage by dividing the same into upper and lower bits, the A/D converter comprising:
   a) means for sampling and holding said analog input voltage;
   b) higher A/D converting means for roughly A/D converting the analog input voltage which has been sampled and held to provide higher bits;
   c) subtracting means for calculating a difference between said sampled and held analog input voltage and a voltage value corresponding to the higher bits calculated by said higher A/D converting means, said subtracting means having
      i) an output terminal for outputting a result of subtraction,
      ii) load means having a first end connected to said sampling and holding means and a second end connected to said output terminal, and
      iii) complementary current output means for applying a first current to generate a desired voltage drop at said second end of said load means and applying a second current complementary to said first current to said first end of said load means;
   d) lower A/D converting means, coupled to said output terminal of said subtracting means, for A/D converting the result of subtraction to calculate lower bits; and
   e) offset voltage removing means, connected to said first end, for removing an offset voltage of impedance converting means.

12. The A/D converter of claim 11, wherein
   said sampling and holding means includes an emitter follower circuit and means coupled between an output node of the emitter follower circuit and the ground terminal for generating a constant current; and
   said offset voltage removing means includes means for generating a current having the same magnitude as the sum of the first and second currents output from said complementary current output means and a direction opposite therein.

13. The A/D converter of claim 11, wherein
   said sampling and holding means includes a transistor, said sampling transistor having its base connected to receive an analog input signal of the high impedance, its collector connected to receive a supply voltage, and its emitter connected to said first end of said load means.

14. The A/D converter of claim 11, wherein
   said sampling and holding means includes a transistor, said transistor having a base connected to receive said analog input signal of high impedance, its collector connected to receive a supply voltage and its emitter connected to said first end of said load means, and
   said offset voltage removing means includes means for applying, to the first end of said load means, a current corresponding to a difference between the sum of the first and second currents outputted from said complementary current output means and the emitter current of said transistor.

15. An A/D converter for A/D-converting an analog input voltage by dividing the same into upper and lower bits, the A/D converter comprising:
   a) means for sampling and holding said analog input voltage and having a transistor with a base, collector and emitter, said base being connected to receive the analog input signal and said collector being connected to a supply voltage node;
   b) higher A/D converting means for roughly A/D converting the analog input voltage which has been sampled and held to provide higher bits;
   c) subtracting means for calculating a difference between said sampled and held analog input voltage and a voltage value corresponding to the higher bits calculated by said higher A/D converting means, said subtracting means having
      i) an output terminal coupled for outputting a result of subtraction,
      ii) a load having a first end connected to said sampling and holding means and a second end connected to said output terminal, wherein said emitter of said sampling and holding means is only connected to said first end, and
      iii) complementary current output means for applying a first current to generate a desired voltage drop at said second end of said load means and applying a second current complementary to said first current to said first end of said load, wherein the sum of the first and second complementary currents is substantially equal to the emitter current of said transistor of said sampling and holding means; and
   d) lower A/D converting means, coupled to said output terminal of said subtracting means, for A/D converting the result of subtraction to calculate lower bits.

16. The A/D converter of claim 15 further comprising means for applying, to said first end of said load, a current corresponding to a difference between the sum of the first and second currents outputted from said complementary current output means and the emitter current of said transistor.

17. The A/D converter of claim 15, wherein said complementary current output means includes D/A converting means for converting a value A/D-converted by an externally provided A/D converter to an analog signal.

* * * * *